US006297118B1

United States Patent
Patti

(10) Patent No.: US 6,297,118 B1
(45) Date of Patent: Oct. 2, 2001

(54) VERTICAL BIPOLAR SEMICONDUCTOR POWER TRANSISTOR WITH AN INTERDIGITZED GEOMETRY, WITH OPTIMIZATION OF THE BASE-TO-EMITTER POTENTIAL DIFFERENCE

(75) Inventor: Davide Patti, Catania (IT)

(73) Assignee: STMicroelectronics S.r.l., Agrate Brianza (Milan) (IT)

( * ) Notice: Subject to any disclaimer, the term of this patent is extended or adjusted under 35 U.S.C. 154(b) by 0 days.

(21) Appl. No.: 09/548,784

(22) Filed: Apr. 13, 2000

Related U.S. Application Data

(62) Division of application No. 09/079,827, filed on May 15, 1998, now Pat. No. 6,069,399.

(30) Foreign Application Priority Data

May 16, 1997 (EP) .................................................. 97830228

(51) Int. Cl.⁷ ...................... H01L 21/331; H01L 21/8222
(52) U.S. Cl. .......................... 438/309; 438/370; 438/363; 438/357; 438/442; 438/526; 257/378; 257/565; 257/592
(58) Field of Search ................................... 438/370, 363, 438/526, 309, 357, 323, 442; 257/592, 565, 378

(56) References Cited

U.S. PATENT DOCUMENTS

| 4,315,271 | 2/1982 | Roger | 357/20 |
|---|---|---|---|
| 5,369,298 | 11/1994 | Honda et al. | 257/583 |
| 5,408,124 | 4/1995 | Palara | 257/580 |
| 5,525,826 | * 6/1996 | Palara | 257/378 |

FOREIGN PATENT DOCUMENTS

| 0 322 040 A2 | 6/1989 | (EP) . |
|---|---|---|
| 0 544 364 A2 | 6/1993 | (EP) . |
| 0 632 505 A1 | 1/1995 | (EP) . |

* cited by examiner

Primary Examiner—Charles Bowers
Assistant Examiner—Hsien Ming Lee
(74) Attorney, Agent, or Firm—Theodore E. Galanthay; Charles J. Rupnick; Seed Intellectual Property Law Group PLLC

(57) ABSTRACT

A transistor including an epitaxial layer with a first conductivity type, a base buried region with a second conductivity type, and a sinker base region with the second conductivity type which extends from a main surface of the transistor to the base buried region, and delimits, together with the base buried region, emitter fingers in the epitaxial layer. The transistor further includes an emitter buried region with the first conductivity type and a doping level which is higher than that of the epitaxial layer. The emitter buried region is embedded in the epitaxial layer in a position adjacent to the base buried region. A sinker emitter region having the first conductivity type and a doping level which is higher than that of the epitaxial layer and extends from the main surface to the emitter buried region inside the emitter fingers. The emitter buried region and the sinker emitter region delimit in each emitter finger pairs of sections which are mutually spaced and delimit between one another a central region of the epitaxial layer. The sinker emitter region of each pair of sections of an emitter finger extend in the vicinity of mutually facing edges of the emitter buried region of the pair of sections.

12 Claims, 4 Drawing Sheets

US 6,297,118 B1

VERTICAL BIPOLAR SEMICONDUCTOR POWER TRANSISTOR WITH AN INTERDIGITZED GEOMETRY, WITH OPTIMIZATION OF THE BASE-TO-EMITTER POTENTIAL DIFFERENCE

CROSS-REFERENCE TO RELATED APPLICATION

This application is a division of U.S. patent application Ser. No. 09/079,827, filed May 15, 1998, now U.S. Pat. No. 6,069,399.

TECHNICAL FIELD

The present invention relates to a vertical bipolar semiconductor power transistor with optimization of the base-to-emitter potential difference.

BACKGROUND OF THE INVENTION

A bipolar transistor of the vertical type is known for example from EPA-0 632 505, and is described hereinafter with reference to FIG. 1. In detail, on a substrate 1 of monocrystalline silicon of N type, there is grown a first epitaxial layer 2, also of N type, but with a lower concentration of doping agent than the substrate 1. On the surface of the first epitaxial layer 2 there is formed, by means of ion implantation and subsequent diffusion steps, a base buried region 3, of P type, and on the latter, an emitter buried region 4, of N type, of which the portion which forms an emitter finger of the interdigitized structure can be seen in full in the FIG. 1. A second epitaxial layer 9 of N type is grown on the first epitaxial layer 2 Then, inside the second epitaxial layer 9, there is formed by ion implantation and a subsequent diffusion step, a sinker or deep base region 6, of P type, with a comb shape, the fingers of which surround the emitter fingers and reach the base buried region 3, forming the surface contacts of the transistor base region.

Subsequently, through the second epitaxial layer 9 there are provided sinker emitter regions 5 and 5a, which are respectively peripheral and central, of N type, which reach the emitter buried region 4, and form the surface contacts of the emitter region of the transistor, with predetermined dimensions and resistivity, such as to form balancing resistors. In particular, the sinker peripheral regions of the emitter 5 extend onto the outer perimeter of the emitter fingers, whereas the sinker central regions of the emitter 5a extend to the centre of the fingers.

Subsequently, screen regions 7, of P type, are provided in the second epitaxial layer 9, inside regions delimited by the sinker peripheral emitter regions 5 and outside the sinker central emitter regions 5a. A comb-shaped surface region 8, of N type, is then provided, the fingers of which extend inside the screen region 7, such as to provide simultaneously a connection between the emitter regions 4 and 5a and the surface of the silicon chip, and distributed balancing resistors (ballast resistors) for the emitter. Therefore, the screen region 7 isolates electrically the fingers formed by the sinker emitter region 4 from the surface region 8, with the exception of the central portion of the fingers.

Then, using known metallization and passivation techniques, on the front surface of the chip the electrodes of the base 10, of the emitter 11, and a metallization line 12 for biasing of the screen region 7 are provided, and on the rear of the chip the collector electrode 13 is provided.

This structure solves the problem of emitter currents which flow through the second epitaxial layer 9 delimited by the sinker peripheral emitter regions 5, which reduce the safe operating area (SOA); however the structure described involves the existence of parasitic components (SCRs and transistors in series with the power transistor) which can be activated in specific conditions, jeopardizing the performance of the power transistor, and a photo lithographic step is required for forming the screen layer 7, and an increased size owing to the presence of the metallization line 12.

SUMMARY OF THE INVENTION

According to principles of the present invention, a power transistor is provided with a sinker base and an interdigitized geometry. The transistor has an emitter region in the form of a comb with fingers which extend inside a base region.

BRIEF DESCRIPTION OF THE DRAWINGS

In order to allow the present invention to be understood, two preferred embodiments are now described, purely by way of non-limiting example, with reference to the attached drawings.

DETAILED DESCRIPTION OF THE INVENTION

Figure 2:
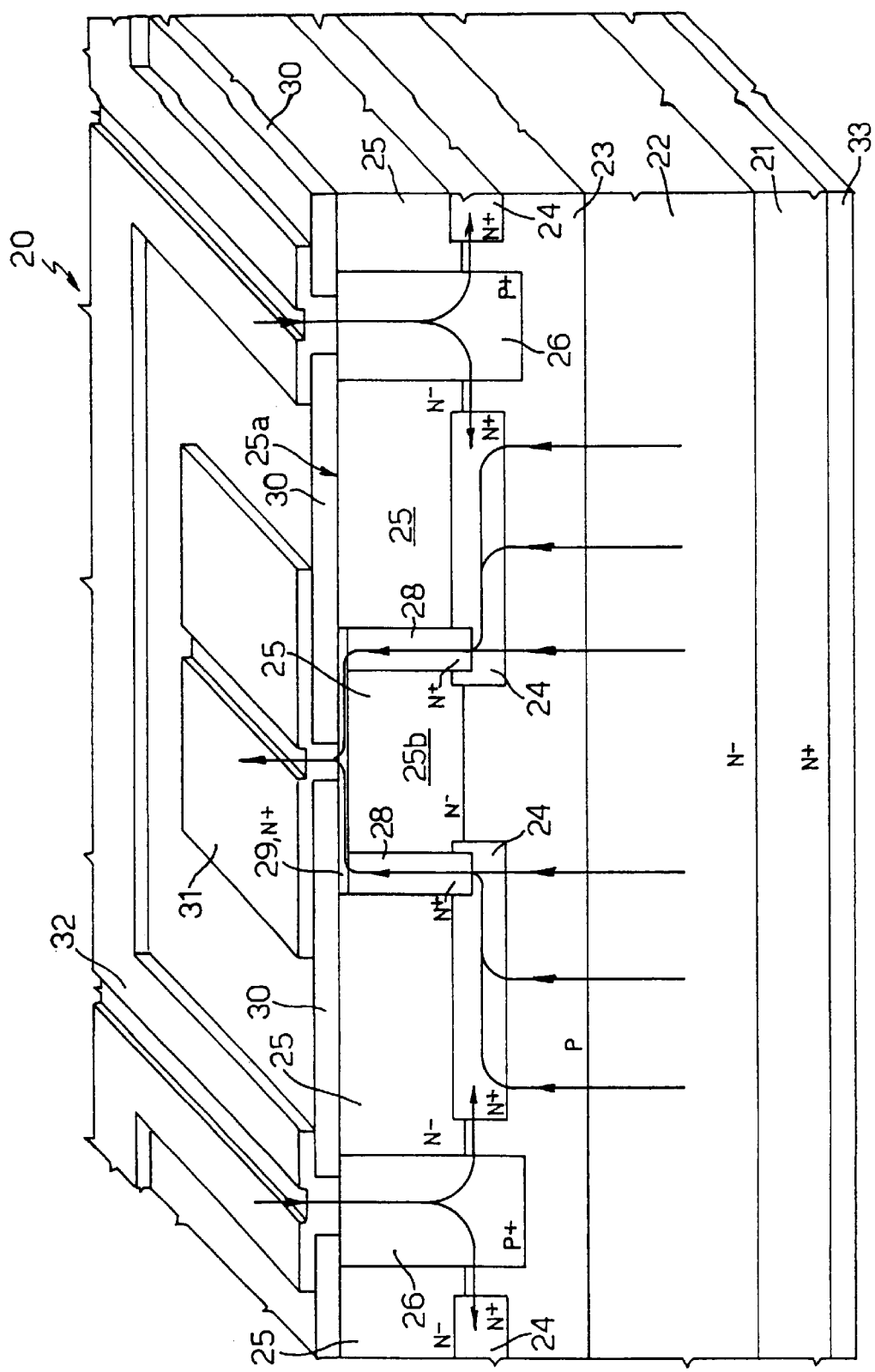
FIG. 2 is a perspective cross-sectional view of a power transistor according to a first embodiment of the invention.

FIG. 2 shows a vertical bipolar NPN power transistor 20 in a chip according to a first embodiment of the invention, the production process of which is described hereinafter.

Figure 3:
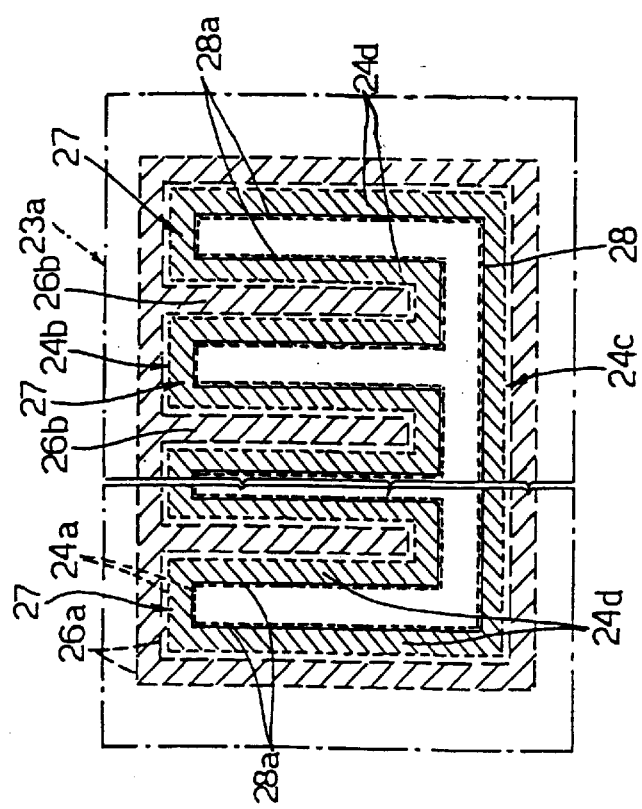
FIG. 3 is a schematic view of the masks used to create some of the regions of the transistor shown in FIG. 2.

On a substrate 21 of N type with a high concentration of doping agents, there is grown a first epitaxial layer 22 which has a concentration and thickness determined in accordance with the voltage at which the transistor 20 must operate, according to criteria known to persons skilled in the art. On the first epitaxial layer 22, there are provided, through an ion implantation and a subsequent diffusion process, a base buried region 23 of P type and an emitter buried region 24 of N type. In particular, as shown in FIG. 3, the base buried region 23 (the outline of which is shown in FIG. 3 with a dot and dash line 23a) has a rectangular shape, and the emitter buried region 24 (the outline of which is represented in FIG. 3 by a short dash line 24a) has a closed shape which comprises a Greek pattern portion 24b and a connection portion 24c, in which the Greek pattern portion 24b forms pairs of buried sections 24d which extend parallel and spaced from one another, and are connected at one end.

Subsequently on the first epitaxial layer 22 there is grown a second epitaxial layer 25 of N type, which has a doping level which is equal to or higher than that of the first epitaxial layer 22, but lower than that of the emitter buried region 24, and which forms a surface 25a of the chip. Through the second epitaxial layer 25 there is formed, by ion implantation and a subsequent diffusion step, a sinker base region 26, of P type, the outline of which is shown in FIG. 3 by the long dash lines 26a. The sinker base region 26, which forms the surface contacts of the base buried region 23, has a closed shape and extends from the surface 25a of the chip to the base buried region 23, with portions 26b which extend between adjacent pairs of buried sections 24d, such as to delimit laterally portions of the second epitaxial layer 25 which form emitter fingers 27. Similarly, subsequently there is formed a sinker emitter region 28, of N type, and with a doping level which is higher than that of the second epitaxial layer 25. The sinker emitter region 28, which is represented by a continuous line in FIG. 3, and which forms the surface contacts of the emitter region, extends from the surface 25a of the chip to the emitter buried region 24 along the mutually facing edge of the pairs of buried sections 24d (i.e. along the edge of the buried sections 24d which is the most distant from the portions 26b of the sinker base region 26), forming a plurality of pairs of parallel sinker sections 28a, each pair being associated with a corresponding emitter finger 27.

Then, by ion implantation, a surface region 29 (FIG. 2) is formed, of N type, and with a doping level which is higher than that of the second epitaxial layer 25. This surface region 29 connects to one another the sinker sections 28a which are associated with a single emitter finger 27, and, together with the sinker emitter region 28 and the emitter buried region 24, it provides resistivity and dimensions such as to form balancing resistors for optimization of the drop in potential between the base and emitter of the transistor 20.

Finally, on the surface 25a of the chip, a passivation layer 30 is deposited and through known photolithography and depositing techniques, electrical contacts and corresponding emitter electrodes 31 and base electrodes 32 are provided. In particular, the contact 29a of the emitter electrode is disposed on the surface region 29 in a position which is equidistant from the sinker sections 28a of each emitter finger 27. In addition, the contact and electrode of the collector 33 are provided on the rear of the chip.

The advantages of the described structure are as follows. Firstly, the transistor 20 has a larger safe operating region (SOA) than standard transistors, since in the condition in which the transistor 20 is switched on, the central region of each emitter finger 27 (portion of the second epitaxial layer between the sinker sections 28a of a single emitter finger, indicated as 25b in FIG. 2) has a low charge injection in the underlying base buried region 23, and thus when it is switched off it must discharge a smaller quantity of charges than known transistors, in which, owing to the distance of the central portion of the base buried region from the base contacts, much of the charges injected by the emitter region above the base region are absorbed directly in the base region itself, without reaching the contacts. As a result, the transistor described has a short fall time when it is switched off.

The structure can easily be integrated in integrated power devices, since all the layers and regions necessary can be produced by means of standard production steps for integrated power devices of this type.

The transistor permits good balancing of the base-to-emitter drop (it should be noted that the presence of the central emitter contact ensures that the surface region 29 has two identical balancing resistors which extend towards each sinker section 28a). There are no parasitic structures which can jeopardize performance in some conditions of use.

The structure does not require screened regions in order to convey the current flow along the required path and to carry out voltage balancing, since this path is unambiguous and is followed naturally by the current flow, as shown by the arrows in FIG. 2.

Figure 1:
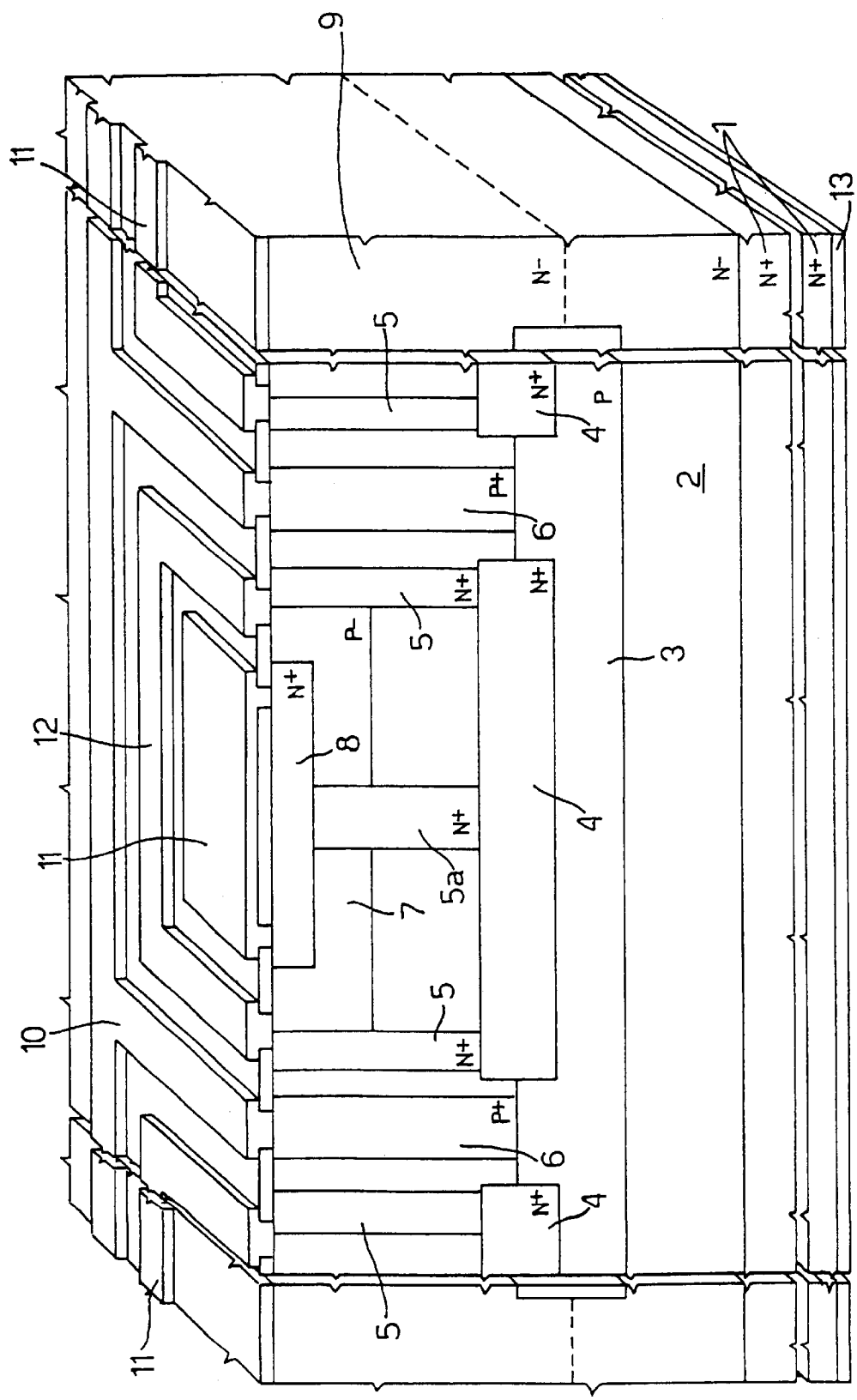
FIG. 1 is a perspective cross-sectional view of a known power transistor.

Finally, the structure described has smaller dimensions than the transistor described with reference to FIG. 1, since it does not require the metal track for biasing the screen region, and does not have base current leakages, and the base current is fully available, thus providing the transistor with increased efficiency.

Figure 5:
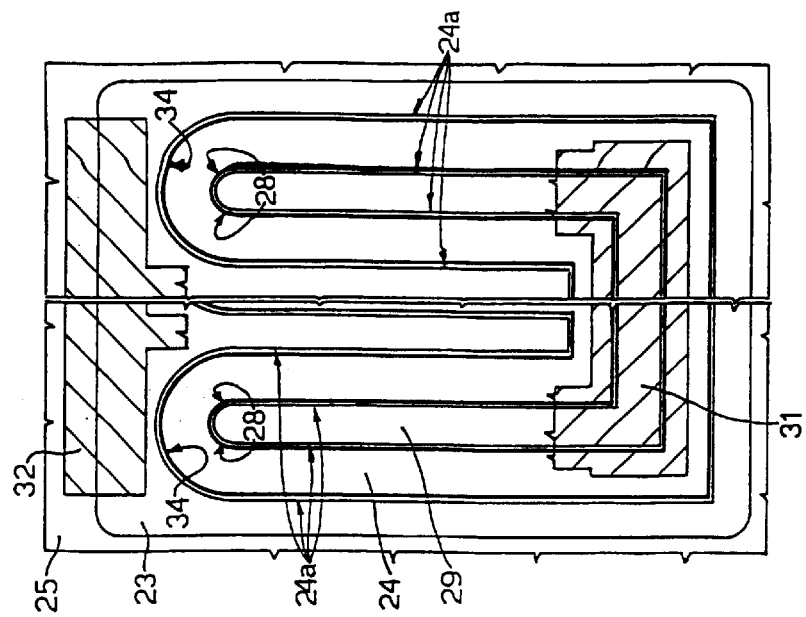
FIG. 5 is a simplified plan view of some of the regions of the structure in FIG. 4.
Figure 4:
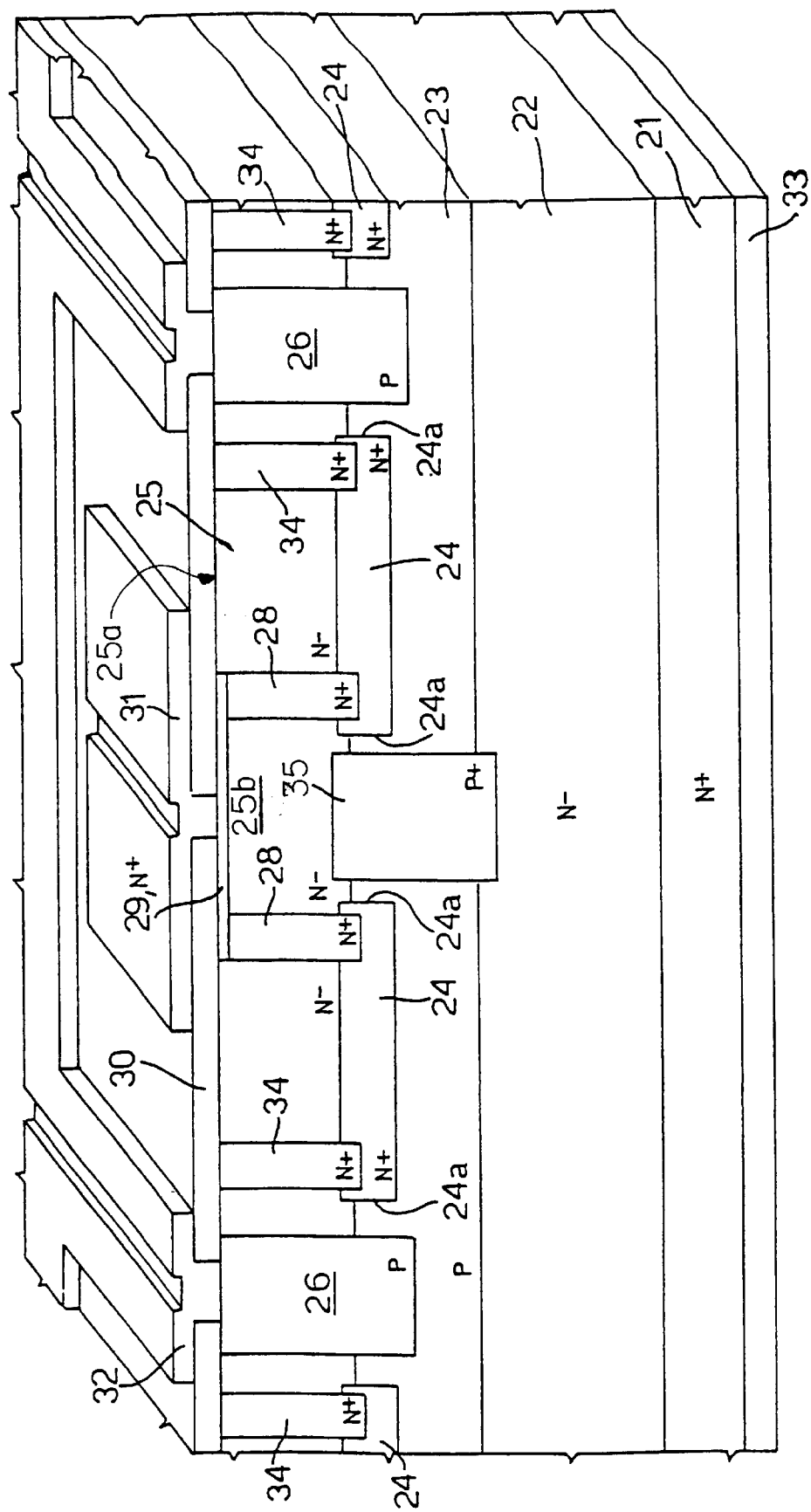
FIG. 4 is a cross-sectional view of a power transistor according to a second embodiment of the invention.

FIGS. 4 and 5 show a second embodiment of the invention which differs from that in FIGS. 2 and 3 in that it comprises an enriched region 35 of a P type and a higher doping level than that of the base buried region 23, which extends inside the base buried region 23, below the central region 25b, along each emitter finger 27, and an emitter external edge region 34, of an N type, and a doping level which is higher than that of the second epitaxial layer 25, which extends in parallel and outside the sinker emitter region 28. In detail, the emitter external edge region 34 forms a closed line, and extends from the surface 25a of the chip to the emitter buried region 24, in a vicinity of mutually remote edges of the pairs of buried sections 24d (i.e. along the edge of the buried sections 24d which is closer to the portions 26b of the sinker base region 26), as can be seen in particular in FIG. 5, in which the emitter external edge region 34 is represented by a continuous line, the sinker base region 26 and the enriched region 35 are not shown, and only part of the emitter electrodes 31 and base electrodes 32 are shown.

The emitter external edge region 34 is advantageously produced during the same implantation step as the sinker emitter region 28, and thus has the same doping level, whereas the enriched region 35 requires a special implantation step carried out before or after the implantation step of the base buried region 23.

Owing to the presence of the emitter external edge region 34, the structure in FIG. 4 has a better current capacity than the structure in FIG. 2, whereas the enriched region 35 forms a region with lower basic resistance, which can discharge the basic current more quickly when the transistor is switched off.

Finally, it will be appreciated that the manufacturing process described and illustrated here can be subjected to numerous modifications and variants, all of which come within the scope of the inventive concept, as defined in the attached claims. For example the conductivity of the P and N regions can be changed in order to obtain a PNP transistor instead of an NPN transistor.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for manufacturing a vertical bipolar semiconductor power transistor with an interdigitized geometry, comprising:

growing a first epitaxial layer with a first conductivity type;

implanting in the first epitaxial layer a base buried region having a second conductivity type and a first doping level, and above this base buried region, an emitter buried region having the first conductivity type and a second doping level;

growing a second epitaxial layer having the first conductivity type and a third doping level lower than the second doping level, the second epitaxial layer defining a main surface;

forming a sinker base region having the second conductivity type and extending from the main surface to the base buried region and laterally and downwards delimiting, together with the base buried region, one or more finger regions in the second epitaxial layer; and forming a sinker emitter region with the first conductivity type and a fourth doping level higher than the third doping level, said sinker emitter region extending from the main surface to the emitter buried region inside the finger regions, the emitter buried region and the sinker emitter region forming in each finger region pairs of sections which are mutually spaced and delimit therebetween a central region in the second epitaxial layer.

2. The method according to claim 1, further comprising the step of, before the step of growing a second epitaxial layer, implanting a conductive region through the base buried region in a position below the central region of the second epitaxial layer, so that the conductive region has the second conductivity type and a seventh doping level higher than the first doping level.

3. A method for manufacturing a vertical bipolar semiconductor power transistor with an interdigitized geometry, comprising:

growing a first epitaxial layer with a first conductivity type;

implanting in the first epitaxial layer a base buried region having a second conductivity type and a first doping level, and above this base buried region, an emitter buried region having the first conductivity type and a second doping level;

growing a second epitaxial layer having the first conductivity type and a third doping level lower than the second doping level, the second epitaxial layer defining a main surface;

forming a sinker base region having the second conductivity type and extending from the main surface to the base buried region and laterally and downwards delimiting, together with the base buried region, one or more finger regions in the second epitaxial layer; and forming a sinker emitter region with the first conductivity type and a fourth doping level higher than the third doping level, said sinker emitter region extending from the main surface to the emitter buried region inside the finger regions, the emitter buried region and the sinker emitter region forming in each finger region pairs of sections which are mutually spaced and delimit between one another a central region in the second epitaxial layer, wherein the emitter buried region and the sinker emitter region of each pair of sections are connected to one another at one end, and at a second end are connected to an emitter buried region and a sinker emitter region of an adjacent pair of sections.

4. The method according to claim 3 wherein the step of forming a sinker emitter region further comprises forming the sinker emitter region such that the emitter buried region of each pair of sections has a width in transverse cross-section which is greater than a width of the sinker emitter region of the pair of sections, and such that the sinker emitter region of each pair of sections extends in a vicinity of mutually facing edges of the emitter buried region of a pair of sections.

5. The method according to claim 4, further comprising the step of forming an emitter surface region with the first conductivity type and a fifth doping level higher than the third doping level such that the emitter surface region extends beneath the main surface between, and in electrical contact with, the sinker emitter region of each pair of sections of each finger region.

6. The method according to claim 5, further comprising the step of forming electrical contact portions of electrically conductive material above the main surface and central to the emitter surface region.

7. The method according to claim 6, further comprising the step of forming, in the second epitaxial layer and simultaneously with the step of forming a sinker emitter region, an emitter external edge region with the first conductivity type and a sixth doping level higher than the third doping level, which extends from the main surface to the emitter buried region, in a vicinity of mutually remote edges of the emitter buried region of each pair of sections.

8. The method according to claim 7, further comprising the steps of:

providing the first conductivity type as an N type; and providing the second conductivity type as a P type.

9. The method according to claim 3, wherein the connected emitter buried region and sinker emitter region of each pair of sections form a Greek pattern shape.

10. A method for manufacturing a vertical bipolar semiconductor power transistor with an interdigitized geometry, comprising:

growing a first epitaxial layer with a first conductivity type;

implanting in the first epitaxial layer a base buried region having a second conductivity type and a first doping level, and above this base buried region, an emitter buried region having the first conductivity type and a second doping level;

growing a second epitaxial layer having the first conductivity type and a third doping level lower than the second doping level, the second epitaxial layer defining a first surface;

forming a sinker base region having the second conductivity type and extending from the first surface to the base buried region and laterally and downwards delimiting, together with the base buried region, one or more finger regions in the second epitaxial layer;

forming a sinker emitter region with the first conductivity type and a fourth doping level higher than the third doping level, said sinker emitter region extending from the first surface to the emitter buried region inside the finger regions, the emitter buried region and the sinker emitter region forming in each finger region pairs of sections which are mutually spaced and delimit therebetween a central region in the second epitaxial layer; and before the step of growing the second epitaxial layer, implanting a conductive region through the base buried region in a position below the central region of the second epitaxial layer, so that the conductive region has the second conductivity type and a fifth doping level higher than the first doping level.

11. A method for manufacturing a vertical bipolar semiconductor power transistor with an interdigitized geometry, comprising:

growing a first epitaxial layer with a first conductivity type;

implanting in the first epitaxial layer a base buried region having a second conductivity type and a first doping level, and above this base buried region, an emitter buried region having the first conductivity type and a second doping level;

growing a second epitaxial layer having the first conductivity type and a third doping level lower than the second doping level, the second epitaxial layer forming a main surface;

forming a sinker base region having the second conductivity type and extending from the main surface to the base buried region and laterally and downwards delimiting, together with the base buried region, one or more finger regions in the second epitaxial layer;

forming a sinker emitter region with the first conductivity type and a fourth doping level higher than the third doping level, said sinker emitter region extending from the main surface to the emitter buried region inside the finger regions, the emitter buried region and the sinker emitter region forming in each finger region pairs of sections which are mutually spaced and delimit between one another a central region in the second epitaxial layer;

forming an emitter surface region with the first conductivity type and a fifth doping level higher than the third doping level such that the emitter surface region extends beneath the main surface between, and in electrical contact with, the sinker emitter region of each pair of sections of each finger region;

forming electrical contact portions of electrically conductive material above the main surface and central to the emitter surface region; and forming in the second epitaxial layer an emitter external edge region with the first conductivity type and a sixth doping level higher than the third doping level, which extends from the main surface to the emitter buried region, in a vicinity of mutually remote edges of the emitter buried region of each pair of sections.

12. The method according to claim 11, wherein the first conductivity type is an N type, and the second conductivity type is a P type.

* * * * *

UNITED STATES PATENT AND TRADEMARK OFFICE
CERTIFICATE OF CORRECTION

PATENT NO.   : 6,297,118 B1
DATED        : October 2, 2001
INVENTOR(S)  : Davide Patti Page 1 of 1

It is certified that error appears in the above-identified patent and that said Letters Patent is hereby corrected as shown below:

<u>Title page,</u>
Item [54], the title should read -- **VERTICAL BIPOLAR SEMICONDUCTOR POWER TRANSISTOR WITH AN *INTERDIGITIZED* GEOMETRY, WITH OPTIMIZATION OF THE BASE-TO-EMITTER POTENTIAL DIFFERENCE** --.

Signed and Sealed this

Twenty-first Day of May, 2002

*Attest:*

JAMES E. ROGAN
*Director of the United States Patent and Trademark Office*

*Attesting Officer*